United States Patent [19]

Mosinski

[11] Patent Number: 5,053,773

[45] Date of Patent: Oct. 1, 1991

[54] DOPPLER COMPENSATED AIRBORNE WEATHER RADAR SYSTEM

[75] Inventor: John D. Mosinski, Cedar Rapids, Iowa

[73] Assignee: Rockwell International Corporation, El Segundo, Calif.

[21] Appl. No.: 324,287

[22] Filed: Mar. 15, 1989

[51] Int. Cl.⁵ .............................................. H03B 5/36
[52] U.S. Cl. ...................................... 342/26; 331/158
[58] Field of Search .................. 342/26; 331/158, 159, 331/160, 116 R, 74

[56] References Cited

U.S. PATENT DOCUMENTS

| | | |
|---|---|---|
| 3,358,244 | 12/1967 | Ho et al. . |
| 3,569,865 | 3/1971 | Healey . |
| 3,581,240 | 5/1971 | Enderby . |
| 3,731,230 | 5/1973 | Cerny, Jr. . |
| 3,747,023 | 7/1973 | Hoft et al. . |
| 4,435,707 | 3/1984 | Clark ..................................... 342/26 |
| 4,484,157 | 11/1984 | Helle et al. . |
| 4,520,326 | 5/1985 | Clemens .......................... 331/116 R |
| 4,536,721 | 8/1985 | Charbonnier ................... 331/116 R |
| 4,550,293 | 10/1985 | Driscoll . |
| 4,600,900 | 7/1986 | Renoult et al. .................. 331/116 R |
| 4,630,008 | 12/1986 | Weeks . |
| 4,646,034 | 2/1987 | Chauvin et al. . |
| 4,797,639 | 1/1989 | Driscoll .............................. 331/158 |

Primary Examiner—Mark Hellner
Attorney, Agent, or Firm—Gregory W. Williams; M. Lee Murrah; H. Fredrick Hamann

[57] ABSTRACT

An airborne weather radar system having a capability of compensating for variable Doppler shift caused by the forward motion of the aircraft and the relative motion of the antenna sweep which includes a local oscillator having a single low phase noise crystal which is operated in its fundamental mode at a predetermined frequency for increasing the pullability away from the tuned frequency of the local oscillator.

8 Claims, 2 Drawing Sheets

DOPPLER COMPENSATED AIRBORNE WEATHER RADAR SYSTEM

TECHNICAL FIELD

The present invention relates to airborne weather radar; and more particularly, concerns airborne weather radar having a local oscillator therein, capable of compensation of Doppler shift, due to the forward motion of the aircraft, and even more particularly, concerns an airborne weather radar system having a local oscillator with a low noise voltage controlled crystal oscillator, therein for compensating for the variable Doppler shift depending on the aircraft speed and the variable antenna direction.

BACKGROUND OF THE INVENTION

In the past, the relative motion of the antenna during its normal sweep and the target, has caused a degradation in the receiver gain and therefore a reduction in the weather detection capabilities of typical airborne weather radar. Previous airborne weather radar systems have included local oscillators which have demonstrated problems in providing tunability over a wide range and yet exhibiting sufficiently low phase noise to eliminate interference with the turbulence detection function of modern weather radar systems.

Consequently, there exists a need for improvement in airborne weather radar systems which are able to compensate for the variable Doppler shift, caused by the forward motion of the aircraft and the relative motion of the antenna sweep; while concomitantly allowing for turbulence detection of a raindrop.

SUMMARY OF THE INVENTION

It is an object of the present invention to provide an airborne weather radar system with the capability of providing for variable compensation for Doppler shift.

It is a feature of the present invention to include a low phase noise voltage controlled crystal oscillator within the weather radar local oscillator.

It is an advantage of the present invention to provide a local oscillator which is tuneable over a wide range.

It is another advantage of the present invention to provide a local oscillator which exhibits low phase noise.

The present invention provides an improved airborne weather radar system which is designed to satisfy the aforementioned needs, produce the earlier propounded objects, include the above described features, and achieve the already articulated advantages. The invention is carried out in a "phase noise-less" approach, in the sense that the phase noise of the local oscillator is sufficiently low, so as to essentially eliminate the interference of the local oscillator with the turbulence detection function of modern weather radar systems.

Accordingly, the present invention relates to an improved airborne weather radar system which utilizes a local oscillator having, therein, a single low phase noise voltage controlled crystal oscillator which exhibits a wide range of tunability while concomitantly providing a low phase noise oscillator.

BRIEF DESCRIPTION OF THE DRAWINGS

The invention may be more fully understood by reading the following Description of the Preferred Embodiment of the invention in conjunction with appended Drawings wherein.

DESCRIPTION OF THE PREFERRED EMBODIMENT

Figure 1:
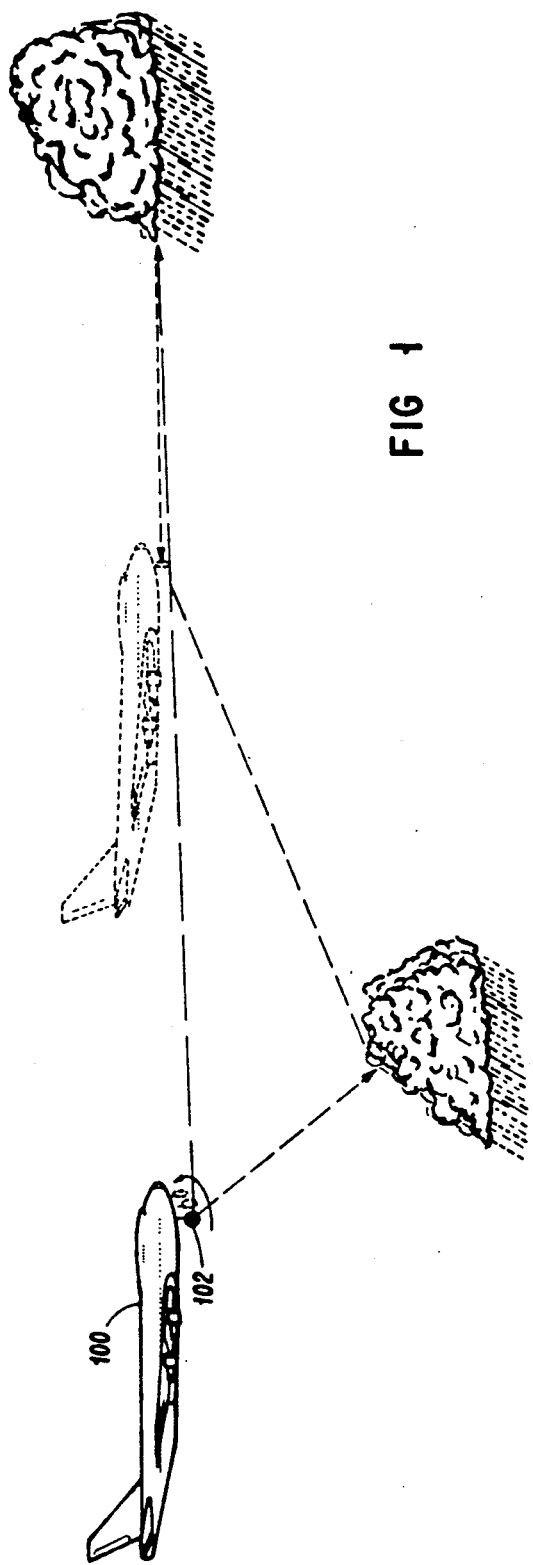
FIG. 1 is a schematic representation of a typical use of an airborne weather radar system to detect raindrop existence and velocity. The aircraft drawn with intermittent lines is used to designate the position of the aircraft after it has traveled for a certain distance.

Now referring to the drawings, and more particularly to FIG. 1. there is shown a schematic representation of a typical environment in which airborne weather radar is used to detect the existence and velocity of rain. The aircraft 100 at its first position is shown having a radar antenna 102 disposed there under for transmitting and receiving radar signals. The antenna is shown transmitting signals in several directions as the antenna sweeps. It is quite clear that the amount of Doppler shift in the received reflected radar signal is a function of the direction of the transmitted signal with respect to the direction of the forward motion of the aircraft. When the antenna is transmitting the radar signal in a direction parallel to the direction of forward motion of the aircraft, the Doppler shift is at its maximum, while it is at is minimum when the transmission direction is at an angle 90 degrees with respect to the direction of forward motion. The amount of Doppler shift will vary as the cosine of the angle between the transmission direction and the direction of forward motion of the aircraft varies. It is this rapid and regular wide variance in the Doppler shift present in the received reflected signals that causes the problem which is solved by the present invention.

Figure 2:
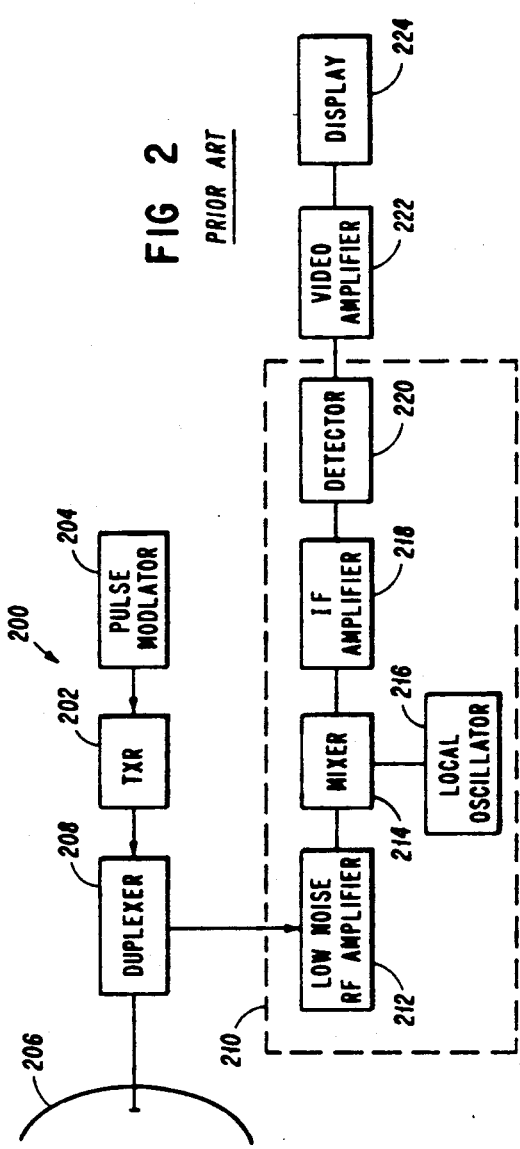
FIG. 2 is a schematic representation of a typical weather radar system of the prior art which includes a local oscillator.

Now referring to FIG. 2 there is shown schematic block diagram of a typical pulsed weather radar generally designated 200, of the prior art. A transmitter 202 may be an oscillator such as an impatt diode, that is pulsed on and off by the pulse modulator 204 to generate a repetitive train of pulses. The pulse width and pulse repetition frequency are variable and are largely a function of the designer's choice with certain obvious limitations. The wave form generated by the transmitter 202 travels via a transmission line to the antenna 206 where it is radiated into space and out to a distant thunder storm. A single antenna 206 is generally used for both transmitting and receiving. The receiver is protected from the damage caused by the high power of the transmitter by the duplexer 208. The duplexer 208 also serves to channel the returned echo signals to the receiver 210 and not to the transmitter 202. The first stage might be a low noise RF amplifier 212 such as a parametric amplifier or a low noise transistor. The receiver input can simply be the mixer stage. The mixer 214 and local oscillator 216 convert the RF signal to an intermediate frequency (IF) which is then amplified by IF amplifier 21B. The higher the quality of the IF signal the higher the performance of the overall radar system. Consequently, the ability of the local oscillator to effectively compensate for the widely variable Doppler shift due to the scanning of the antenna is quite important.

The detector 220 is used to extract the pulse modulation from the IF signal which is then amplified by the video amplifier 222 to a level where it can be properly displayed by the cockpit display 224.

Figure 3:
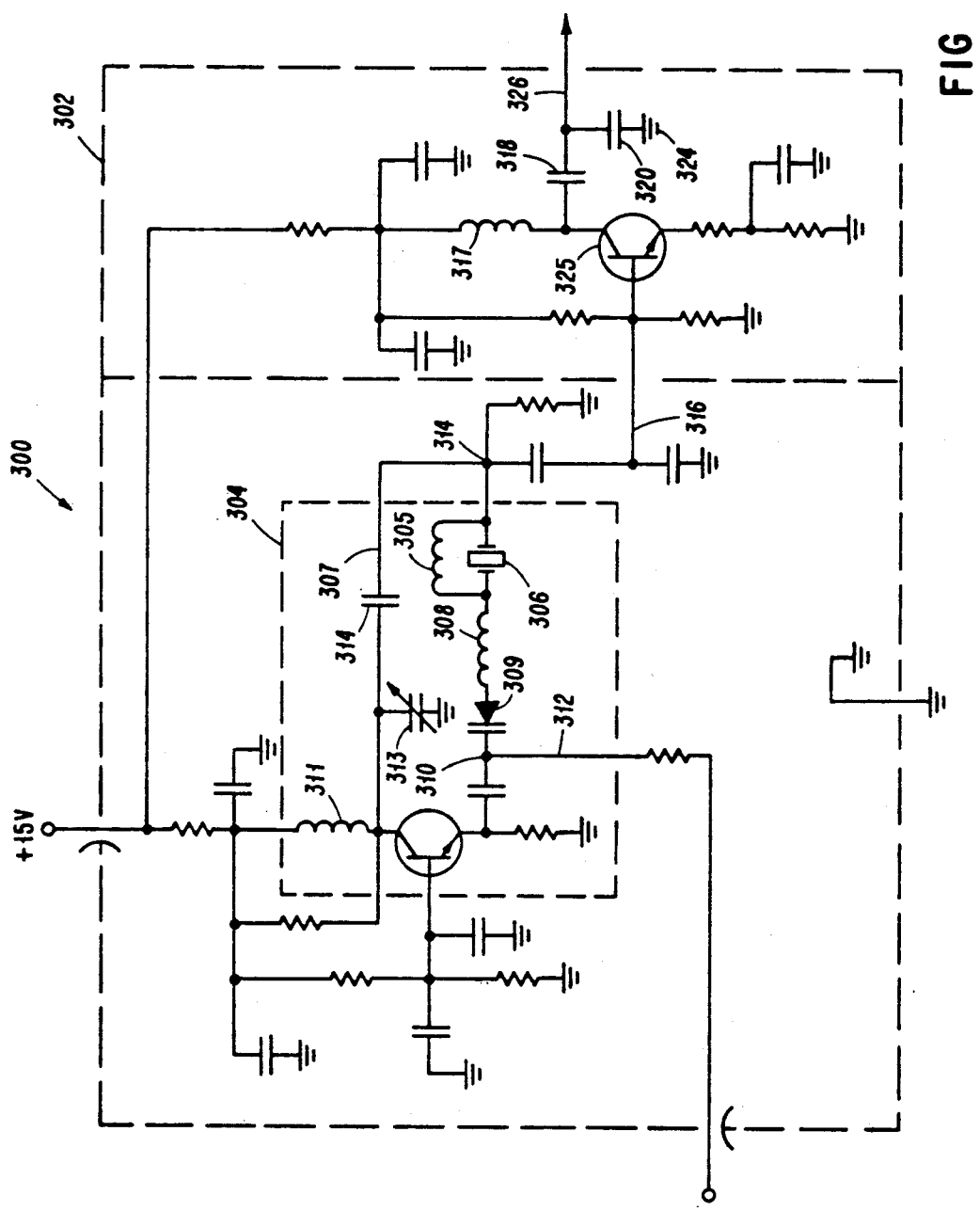
FIG. 3 is an electronic schematic diagram of a preferred embodiment of the present invention which contains the low phase noise voltage controlled crystal oscillator.

Now referring to FIG. 3 there is shown a preferred embodiment of the present invention which includes an improved local oscillator which is capable of compensating for the widely varying Doppler shift caused by the sweep of the radar antenna. The local oscillator generally designated 300 is shown having a crystal 306 disposed therein. Crystal 306 is preferably a low phase noise crystal which is operable in its fundamental mode at the desired frequency which is a function of the chosen radar frequency, the chosen IF, and the Doppler shift of that frequency. The local oscillator 300 is properly tuned by tuning the crystal 306 with inductor 305 to operate the crystal 306 near its series resonance for increased pullability and linearity. One method for accomplishing this is to tune out the $C_o$ of the crystal 306 with inductor 305 and add another inductor 308 in series. The local oscillator output frequency is on line 316.

The oscillator circuit found within intermittent line 304 includes crystal 306 and several other functions. Feedback is accomplished with line 307, which includes the tuned circuit of inductor 311, variable capacitor 313 and capacitor 314. The pulling of the oscillator away from its tuned frequency is achieved by providing a variable DC voltage on line 312 to junction 310 which is coupled to the crystal 306 through a tuned circuit including varactor diode 309 and inductor 308. The amplifier circuit found within intermittent line 302 amplifies the local oscillator output frequency on line 316 through the tuned circuit which includes inductor 317, capacitor 318 and capacitor 320. The amplifier output frequency is on line 326.

In operation, the local oscillator provides for a tuned frequency output having a high degree of pullability away from the tuned frequency. This allows the local oscillator output frequency to be variable to account for the variance in the received reflected signals due to Doppler shift.

It is thought that the airborne weather radar system of the present invention, in many of its attended advantages, will be understood from the foregoing description, and will be apparent that various changes may be made in the form, construction, and arrangement of the parts thereof, without departing from the spirit and scope of the invention, or sacrificing all of their material advantages, the forms herein before being merely preferred or exemplary embodiments thereof. It is the intention of the appended claims to cover all such changes.

I claim:

1. An improved airborne weather radar system comprising:
    a high frequency pulsed microwave transmitter, for generating a train of microwave pulses;
    a directional antenna having a plurality of operating positions for radiating the train of pulses from said transmitter out into space;
    a low noise RF amplifier for amplifying received reflected signals;
    a duplexer interposed between and interconnecting said antenna, said transmitter, and said low noise RF amplifier;
    a local oscillator having a single low phase noise crystal oscillator which is operable at its fundamental mode at a predetermined frequency which varies with said directional antenna operating positions;
    a mixer interposed between said low noise RF amplifier and said local oscillator; and
    a display device for displaying the output signal from said mixer.

2. A local oscillator for compensating for widely varying received reflected radar signals, due to the variable Doppler shift caused by the antenna sweep in airborne radar apparatus, the local oscillator comprising:
    a low phase noise crystal, for operation in its fundamental mode at a predetermined frequency;
    a first inductor coupled in parallel with said crystal;
    a second inductor coupled in series with said first inductor and said crystal;
    a varactor diode coupled in series with said second inductor;
    a variable positive DC voltage source coupled in series with said varactor diode, so that, said DC voltage source, said first inductor, said second inductor and said varactor diode provide for pullability of said crystal away from said predetermined frequency.

3. A local oscillator comprising:
    a single crystal operating in its fundamental mode having, increased pullability at a predetermined frequency;
    means for tuning said crystal for operation at said predetermined frequency by reducing the shunt capacitance of said single crystal; and
    means for pulling said operating frequency of said crystal away from said predetermined frequency.

4. A local oscillator of claim 3 wherein said means for tuning said crystal for operation at said predetermined frequency comprises a first inductor coupled in parallel with said crystal.

5. A local oscillator comprising:
    a crystal operating in its fundamental mode, having increased pullability at a predetermined frequency;
    means for tuning said crystal for operation at said predetermined frequencies;
    means for pulling said operating frequency of said crystal away from said predetermined frequency;
    said means for tuning said crystal for operation at said predetermined frequency comprising a first inductor coupled in parallel with said crystal; and
    said means for pulling said operating frequency of said crystal away from said predetermined frequency comprises a first inductor coupled in parallel with said crystal, a second inductor coupled in series with said first inductor and said crystal, a variable capacitor means coupled in series with said second inductor and a variable DC voltage source coupled in series with said variable capacitor means.

6. A local oscillator of claim 5 wherein said variable capacitor means comprises a varactor diode.

7. A local oscillator of claim 6 further comprising means for accomplishing feedback of the output of said crystal with said variable DC voltage source.

8. An airborne weather radar apparatus, for detecting precipitation in the skies about an aircraft, the radar apparatus being of the type having a sweeping antenna, so that, radar signals can be transmitted to and received from precipitation at various angles with respect to the forward motion of the aircraft;

the radar apparatus comprising a high frequency pulsed microwave transmitter, for generating a train of microwave pulses;

an antenna for radiating said train of pulses from said transmitter out in to space; means for sweeping said antenna through a predetermined range of angles;

a low noise RF amplifier for amplifying received reflected signals;

a duplexer interposed between and interconnecting said antenna, said transmitter and said low noise RF amplifier;

a local oscillator having a low phase noise crystal, for operation in its fundamental mode at a predetermined frequency, a first inductor coupled in parallel with said crystal, a second inductor coupled in series with said first inductor and said crystal, a varactor diode coupled in series with said second inductor and a variable positive DC voltage source coupled in series with said varactor diode, so that, said local oscillator operates at a predetermined frequency and is pulled away from said predetermined frequency by variations in said variable positive DC voltage source;

a mixer interposed between said low noise RF amplifier and said local oscillator; and a display device for displaying the output signal from said mixer.

* * * * *